United States Patent
Uda et al.

(10) Patent No.: US 9,048,191 B2
(45) Date of Patent: Jun. 2, 2015

(54) PLASMA ETCHING METHOD

(75) Inventors: Shuichiro Uda, Miyagi (JP); Takaaki Nezu, Miyagi (JP); Shinji Fuchigami, Miyagi (JP); Koji Maruyama, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/125,363

(22) PCT Filed: Jun. 12, 2012

(86) PCT No.: PCT/JP2012/065034
§ 371 (c)(1),
(2), (4) Date: Dec. 11, 2013

(87) PCT Pub. No.: WO2012/173122
PCT Pub. Date: Dec. 20, 2012

(65) Prior Publication Data
US 2014/0113450 A1    Apr. 24, 2014

(30) Foreign Application Priority Data

Jun. 15, 2011    (JP) .................................. 2011-133482

(51) Int. Cl.
| | | |
|---|---|---|
| H01L 21/3065 | (2006.01) | |
| H01L 21/67 | (2006.01) | |
| H01L 21/3213 | (2006.01) | |
| H01J 37/32 | (2006.01) | |
| H01L 21/768 | (2006.01) | |
| H01L 21/308 | (2006.01) | |

(52) U.S. Cl.
CPC ...... *H01L 21/3065* (2013.01); *H01L 21/67069* (2013.01); *H01L 21/30655* (2013.01); *H01L 21/32132* (2013.01); *H01L 21/32137* (2013.01); *H01J 37/32449* (2013.01); *H01J 37/32669* (2013.01); *H01L 21/76898* (2013.01); *H01L 21/308* (2013.01); *H01L 21/3081* (2013.01); *H01J 37/32165* (2013.01); *H01J 37/3266* (2013.01); *H01J 2237/334* (2013.01)

(58) Field of Classification Search
CPC ..................... H01L 21/3065; H01L 21/67069; H01L 21/30655; H01L 21/32132; H01L 21/32137; H01L 21/308; H01L 21/31138; H01L 21/31144
See application file for complete search history.

(56) References Cited

U.S. PATENT DOCUMENTS

| | | | | |
|---|---|---|---|---|
| 2004/0061238 | A1* | 4/2004 | Sekine ........................ | 257/774 |
| 2009/0221148 | A1* | 9/2009 | Uda et al. ................... | 438/696 |

FOREIGN PATENT DOCUMENTS

JP    2009-206401    9/2009

* cited by examiner

*Primary Examiner* — Lan Vinh
*Assistant Examiner* — Jiong-Ping Lu
(74) *Attorney, Agent, or Firm* — IPUSA, PLLC

(57) ABSTRACT

A plasma etching method includes supplying an etching gas containing an oxygen gas and a sulfur fluoride gas at a predetermined flow rate into a processing chamber that accommodates a processing substrate including a silicon layer and a resist layer, and etching the silicon layer with plasma generated from the etching gas using the resist layer as a mask. The plasma etching method further includes a first step of etching the silicon layer while a flow ratio of the oxygen gas to the sulfur fluoride gas is adjusted to a first flow ratio; a second step of etching the silicon layer while decreasing a flow rate of the oxygen gas to decrease the flow ratio to a second flow ratio, which is lower than the first flow ratio; and a third step of etching the silicon layer while the flow ratio is adjusted to the second flow ratio.

5 Claims, 17 Drawing Sheets

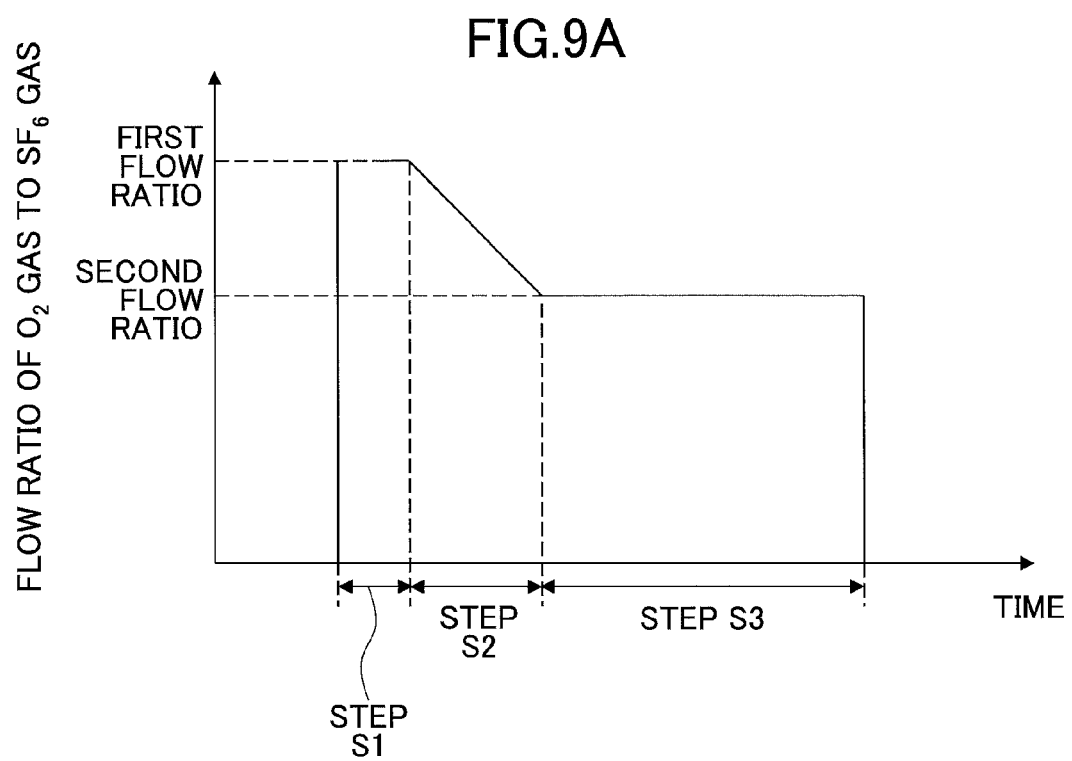

<COMPARATIVE EXAMPLE 2>

SF$_6$+O$_2$ PLASMA (O$_2$ LOW)

FIG.21

<TABLE 1>

| STEP No. | PRESSURE (mTorr) | FIRST HIGH FREQUENCY POWER (W) | SECOND HIGH FREQUENCY POWER (W) | SF$_6$ FLOW RATIO (sccm) | O$_2$ FLOW RATIO (sccm) | SiF$_4$ FLOW RATIO (sccm) | HBr FLOW RATIO (sccm) | TEMPER-ATURE (°C) | TIME (SEC) |
|---|---|---|---|---|---|---|---|---|---|
| S1-1 | 200 | 1800 | 50 | 150 | 165 | 800 | 120 | 40 | 10 |
| S1-2 | 200 | 1800 | 0 | 150 | 165 | 800 | 120 | 40 | 10 |
| S2-1 | 200 | 1800 | 0 | 150 | 150 | 800 | 120 | 40 | 10 |
| S2-2 | 200 | 1800 | 0 | 150 | 140 | 800 | 120 | 40 | 10 |
| S2-3 | 200 | 1800 | 0 | 150 | 130 | 800 | 120 | 40 | 10 |
| S3 | 200 | 1800 | 0 | 150 | 120 | 800 | 120 | 40 | 320 |

PLASMA ETCHING METHOD

TECHNICAL FIELD

The present invention relates to a plasma etching method.

BACKGROUND ART

In the field of semiconductor device manufacturing, numerous efforts have been made to increase the density of semiconductor devices through their miniaturization. Recently, attention is being directed to a semiconductor device stacking technique called three-dimensional (3D) packaging as means for increasing the density per unit area of semiconductor devices.

Semiconductor devices stacked in the vertical direction may include electrodes that are arranged to penetrate through a substrate including a silicon layer, for example. In this way, the semiconductor devices may be electrically connected via the electrodes. To create such an electrode that penetrates through a substrate, a resist is applied on the substrate using a coater, the resist is exposed using an exposure apparatus, and a resist pattern is developed using a developing apparatus. The resist is then used as a mask to etch the substrate using a plasma etching apparatus to create a hole portion such as a through hole or a via hole. After creating the hole portion in the substrate, the resist remaining on the substrate is removed by asking.

When etching a substrate including a silicon layer, for example, a plasma may be generated from an etching gas including a fluorine-containing compound gas such as $SF_6$ gas and the substrate may be etched using the generated plasma.

The hole portion as described above generally has to be etched to a depth of approximately 100 μm. However, when the etching gas is made up of a fluorine-containing compound gas such as $SF_6$ gas alone, etching by the plasma generated from such an etching gas tends to be isotropic. In this case, side walls of the resist pattern may be susceptible to etching as well. As a result, the substrate may be undercut or etched laterally and a side wall of the hole portion may not be arranged to have a vertical configuration.

In this respect, a technique is known that involves performing a step of forming a protective film on an upper face and a side wall of a resist pattern before starting a plasma etching step for etching a silicon layer, the protective film being formed using plasma generated from an etching gas for prompting deposition materials to be deposited on the substrate surface (see e.g., Patent Document 1). In this way, the side wall of the resist pattern may be prevented from being etched and undercut may be prevented.

PRIOR ART DOCUMENTS

Patent Documents

Patent Document 1: Japanese Laid-Open Patent Publication No. 2009-206401

SUMMARY OF THE INVENTION

Problem to be Solved by the Invention

However, recently, applications requiring a hole portion with a depth of at least 100 μm are becoming common, and as the depth of the hole portion increases, the time required for etching the hole portion increases. Also, in view of demands for further miniaturization of the semiconductor device, applications requiring a hole portion with a relatively small diameter of approximately 10-20 μm are increasing as well.

In the case of attempting to meet such requirements using the conventional etching process that involves forming a protective film on the upper face and side wall of the resist pattern and performing plasma etching on a silicon layer thereafter, the protective film has to be formed at a sufficient thickness to withstand exposure to plasma for a long period of time. As a result, the process time required for the protective film forming step may be increased and the overall process time of the plasma etching process may be further increased. Thus, the silicon layer may not by etched at a high etching rate and productivity of the semiconductor device may decrease.

Also, as the diameter of the hole portion to be formed becomes smaller, the ratio of the thickness of the protective film formed on the side wall of the hole portion with respect to the diameter of the hole portion increases. In such case, it may become increasingly difficult to form the side wall of the hole portion into a vertical configuration due to variations in the thickness of the protective film along the depth direction of the hole portion, for example. Also, as the diameter of the hole portion to be formed becomes smaller, it may became increasingly difficult for the etching gas for depositing the protective film to reach the side wall of the hole portion, and forming the protective film may become more difficult as a result. This may cause an undercut and the configuration of the side wall of the hole portion may not be maintained vertical with respect to the surface of the substrate.

In light of the above problems, it is an object of at least one aspect of the present invention to provide a plasma etching method for etching a hole portion on a surface of a substrate on which a resist pattern is formed, the method enabling a side wall of the hole portion to be formed substantially vertical with respect to the surface of the substrate, and enabling the silicon layer to be etched at high speed.

Means for Solving the Problem

According to one embodiment of the present invention, a plasma etching method is provided that involves supplying an etching gas containing an oxygen gas and a sulfur fluoride gas at a predetermined flow rate into a processing chamber that accommodates a processing substrate, which includes a silicon layer and a resist layer that is arranged into a predetermined pattern on the silicon layer, and etching the silicon layer with plasma generated from the etching gas supplied to the processing chamber using the resist layer as a mask. The plasma etching method includes a first step of etching the silicon layer while a flow ratio of the oxygen gas to the sulfur fluoride gas is adjusted to a first flow ratio; a second step of etching the silicon layer while decreasing a flow rate of the oxygen gas to decrease the flow ratio of the oxygen gas to the sulfur fluoride gas to a second flow ratio, which is lower than the first flow ratio; and a third step of etching the silicon layer while the flow ratio of the oxygen gas to the sulfur fluoride gas is adjusted to the second flow ratio.

According to another embodiment of the present invention, a plasma etching method is provided that involves supplying an etching gas containing an oxygen gas and a sulfur fluoride gas at a predetermined flow rate into a processing chamber that accommodates a processing substrate, which includes a silicon layer and a resist layer that is arranged into a predetermined pattern on the silicon layer, and etching the silicon layer with plasma generated from the etching gas supplied to the processing chamber using the resist layer as a mask. The plasma etching method includes an initial etching step including depositing a protective film on a surface of the processing substrate while applying a first magnetic field to the processing substrate and adjusting a flow ratio of the oxygen gas to the sulfur fluoride gas to a first flow ratio. The first magnetic field is greater than a predetermined magnetic field which, when applied while the flow ratio of the oxygen gas to the sulfur fluoride gas is adjusted to the first flow ratio, causes an etching rate of etching the protective film to be equal to a deposition rate of depositing the protective film on the surface of the processing substrate through reaction of the plasma generated from the etching gas with the resist layer. The plasma etching method further includes a subsequent etching step, to be performed as etching progresses, including decreasing a flow rate of the oxygen gas while applying the first magnetic field to the processing substrate, and increasing the etching rate relative to the deposition rate.

According to another embodiment of the present invention, a plasma etching method is provided that involves supplying an etching gas containing an oxygen gas and a sulfur fluoride gas at a predetermined flow rate into a processing chamber that accommodates a processing substrate, which includes a silicon layer and a resist layer that is arranged into a predetermined pattern on the silicon layer, and etching the silicon layer with plasma generated from the etching gas supplied to the processing chamber using the resist layer as a mask to form a hole portion. The plasma etching method includes an initial etching step including depositing a protective film on a surface of the resist layer and a side wall of the hole portion to be formed while applying a first magnetic field to the processing substrate and adjusting a flow ratio of the oxygen gas to the sulfur fluoride gas to a first flow ratio. The first magnetic field is greater than a predetermined magnetic field which, when applied while the flow ratio of the oxygen gas to the sulfur fluoride gas is adjusted to the first flow ratio, causes an etching rate of etching the protective film to be equal to a deposition rate of depositing the protective film on the surface of the resist layer and the side wall of the hole portion through reaction of oxygen radicals within the plasma generated from the etching gas with the resist layer. The plasma etching method further includes a subsequent etching step, to be performed as a depth dimension of the hole portion increases, including decreasing a flow rate of the oxygen gas while applying the first magnetic field to the processing substrate, and increasing the etching rate relative to the deposition rate.

Advantageous Effect of the Invention

According to an aspect of the present invention, when etching a hole portion on a surface of a substrate on which a resist pattern is formed, a side wall of the hole portion maybe formed substantially vertical with respect to the surface of the substrate and a silicon layer may be etched at high speed.

BRIEF DESCRIPTION OF THE DRAWINGS

FIG. 9A is a graph illustrating a change in a ratio of $O_2$ gas to $SF_6$ gas during process steps of etching a silicon layer;

FIG. 21 is a table illustrating exemplary process steps of etching a silicon layer according to the first embodiment.

EMBODIMENTS FOR IMPLEMENTING THE INVENTION

In the following, embodiments of the present invention are described with reference to the accompanying drawings.

First Embodiment

First, a plasma etching method according to a first embodiment of the present invention is described.

Figure 1:
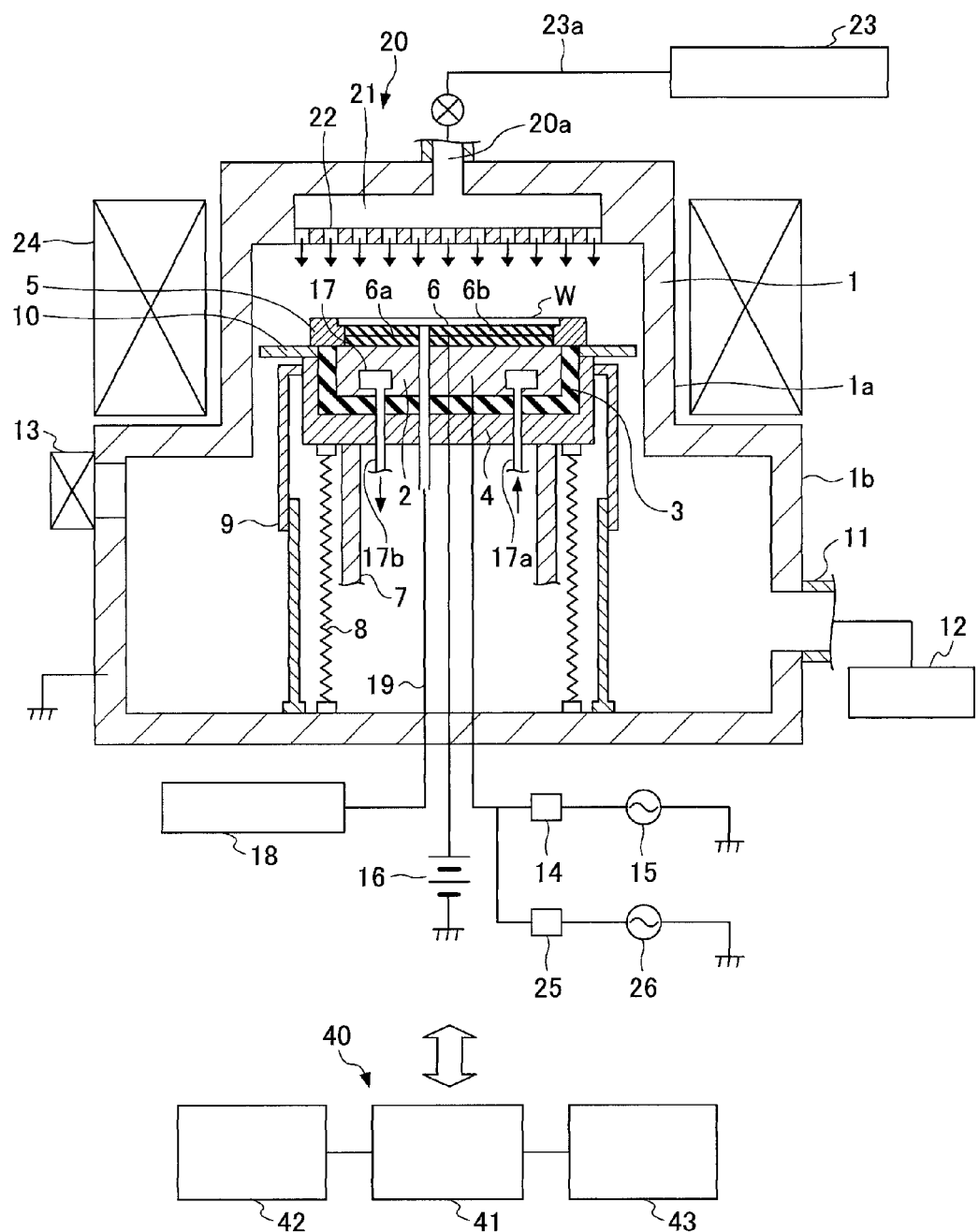
FIG. 1 is a schematic cross-sectional view illustrating a configuration of a plasma etching apparatus for implementing a plasma etching method according to a first embodiment of the present invention.
Figure 2:
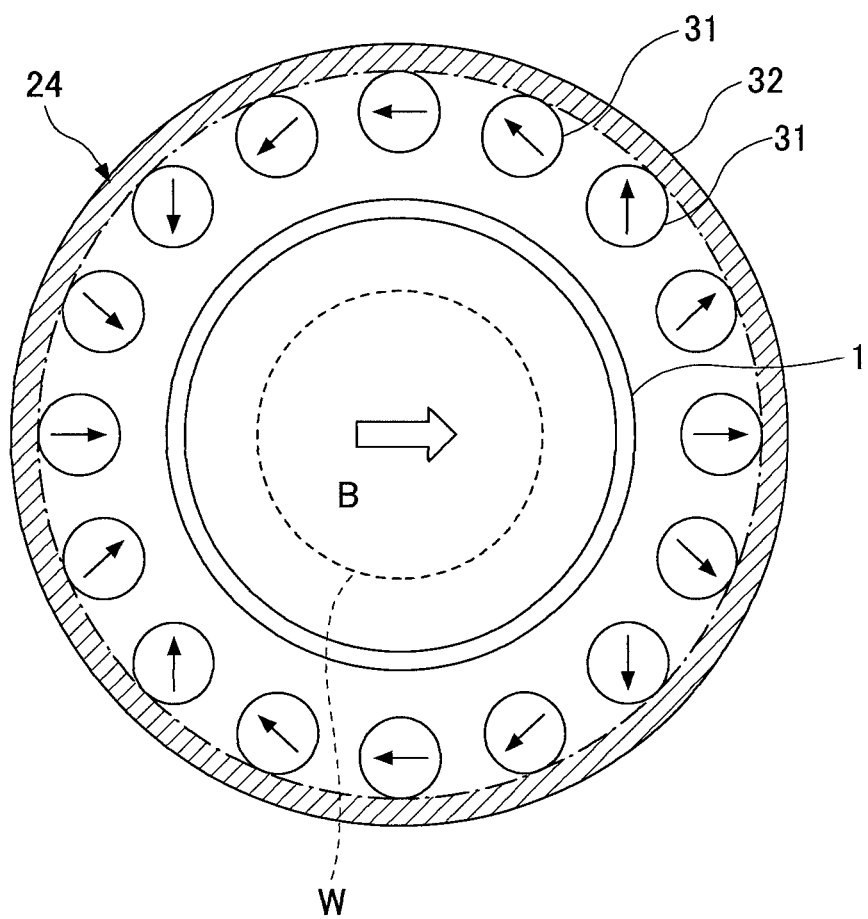
FIG. 2 is a lateral cross-sectional view illustrating a configuration of a dipole ring magnet of the plasma etching apparatus of FIG. 1.
Figure 3:
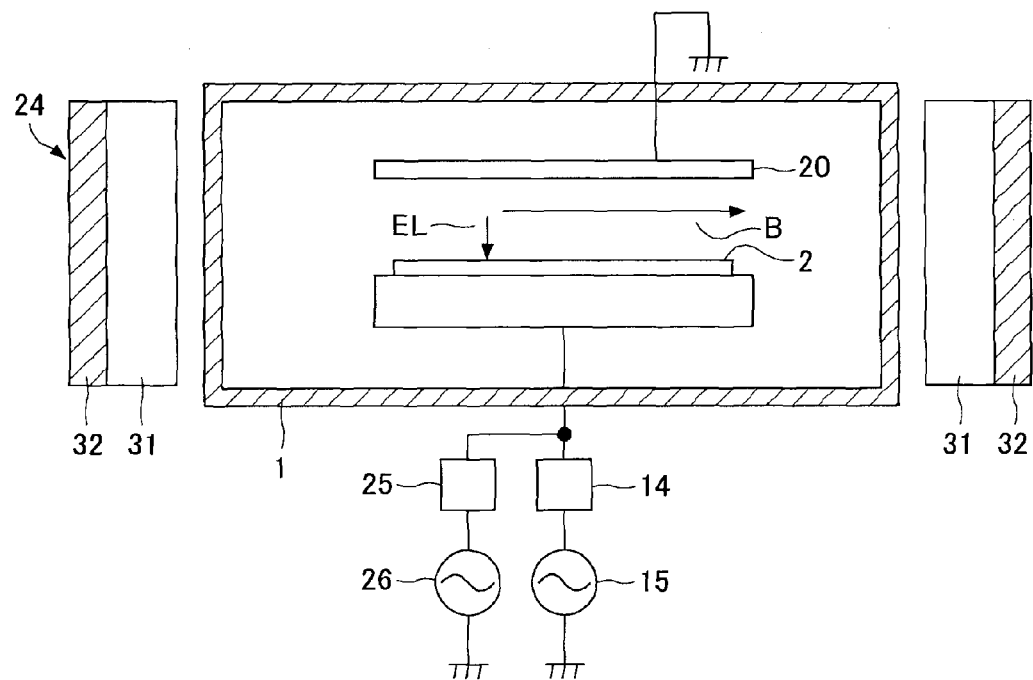
FIG. 3 illustrates an electric field and a magnetic field that are generated within a chamber of the plasma etching apparatus of FIG. 1.
Figure 4:
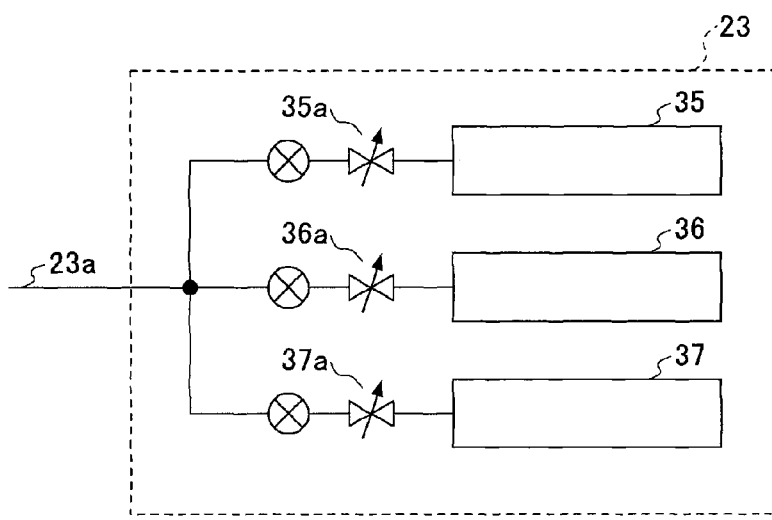
FIG. 4 illustrates a configuration of an etching gas supply part of the plasma etching apparatus of FIG. 1.

FIG. 1 is a schematic cross-sectional view illustrating a configuration of a plasma etching apparatus suitable for implementing the plasma etching method according to the present embodiment. FIG. 2 is a lateral cross-sectional view illustrating a configuration of a dipole ring magnet 24. FIG. 3 illustrates an electric field and a magnetic field that are generated within a chamber 1. FIG. 4 illustrates a configuration of an etching gas supply part 23.

The illustrated plasma etching apparatus corresponds to a reactive ion etching (RIE) type plasma etching apparatus that includes a chamber (processing chamber) 1 that may be made of a metal such as aluminum or stainless steel, for example.

A table or susceptor 2 that is configured to hold a processing object such as a silicon wafer W (simply referred to as "wafer W" hereinafter) is arranged inside the chamber 1. The suscpetor 2 may be made of aluminum, for example, and is supported by a conductor support 4 via an insulating member 3. A focus ring 5 that may be made of quartz, for example, is arranged along an upper face periphery of the susceptor 2. An electrostatic chuck 6 that holds the wafer W with an electrostatic attraction force is arranged on the upper face of the susceptor 2. The suscpetor 2 and the support 4 may be raised and lowered by an elevating mechanism including a ball screw 7. An elevator drive part (not shown) arranged at a lower side of the support 4 is covered by a bellows 8 made of stainless steel. A bellows cover 9 is arranged at the outer side of the bellows 8. A lower face of the focus ring 5 is connected to a baffle plate 10, and the focus ring 5 establishes electrical conduction with the chamber 1 via the baffle plate 10, the support 4, and the bellows 8. The chamber 1 is grounded.

Note that the suscpetor 2 and the support 4 correspond to an exemplary embodiment of a support part of the present invention.

The chamber 1 includes an upper part 1a with a smaller diameter and a lower part 1b with a larger diameter than that of the upper part 1a. An exhaust port 11 is formed at a side wall of the lower part 1b of the chamber 1, and an exhaust system 12 is connected to the exhaust port 11 via an exhaust pipe. By activating a vacuum pump of the exhaust system 12, the pressure within the processing chamber 1 may be reduced to a predetermined degree of vacuum. Further, a gate valve 13 that is configured to open/close a loading/unloading port for the wafer W is arranged at the side wall of the lower part 1b of the processing chamber 1.

A first high frequency power supply 15 for plasma generation and reactive ion etching (RIE) is electrically connected to the susceptor 2 via a matching unit 14. The first high frequency power supply 15 may be configured to supply a first high frequency power having a first frequency of 40 MHz, for example, to the lower electrode (i.e., susceptor 2).

A shower head 20, which is maintained at ground potential, is arranged at a ceiling portion of the chamber 1 as an upper electrode (described in detail below). Accordingly, the first high frequency power from the first frequency power supply 15 is supplied between the susceptor 2 and the shower head 20.

A second high frequency power supply 26 is electrically connected in parallel with the first high frequency power supply 15 to the susceptor 2 via a matching unit 25. The second high frequency power supply 26 may be configured to cumulatively supply to the susceptor 2 a second high frequency power having a second high frequency of 3.6 MHz, for example, which is lower than the first high frequency of the first high frequency power supplied by the first high frequency power supply 15. As described below, the second high frequency power from the second high frequency power supply 26 is for preventing generation of a side wall roughness at the hole portion when forming the hole portion.

The electrostatic chuck 6 includes an electrode 6a made of a conductive film that is arranged between a pair of insulting sheets 6b. A DC power supply 16 is electrically connected to the electrode 6a. When a DC voltage from the DC power supply 16 is applied to the electrode 6a, the electrostatic chuck generates an electrostatic attraction force for attracting the wafer W thereto.

A coolant chamber 17 extending in a circumferential direction, for example, is arranged within the susceptor 2. A coolant such as cooling water at a predetermined temperature may be circulated from an external chiller unit (not shown) to the coolant chamber 17 via pipes 17a and 17b. A processing temperature for the processing of the wafer W placed on the suscpetor 2 may be controlled by the temperature of the coolant. In order to arrange the side wall of the hole portion to be formed through etching to be substantially vertical, the temperature of the susceptor 2 is preferably arranged to be a low temperature of approximately −30 degrees (° C.).

Further, a cooling gas such as He gas from a gas introducing mechanism 18 may be supplied between the upper face of the electrostatic chuck 6 and a backside of the wafer W via a gas supply line 19. The gas introducing mechanism 18 is configured to be capable of individually controlling a gas pressure (i.e., backpressure) of a wafer center portion and a wafer edge portion.

The shower head 20 at the ceiling portion has multiple gas discharge ports 22 arranged at its lower face that faces parallel to the upper face of the susceptor 2. A buffer chamber 21 is arranged at the inner side of the gas discharge face of the shower head 20, and a gas supply pipe 23a of the etching gas supply part 23 is connected to a gas introduction port 20a of the buffer chamber 21.

The dipole ring magnet 24 may be arranged to extend annularly or concentrically around the periphery of the upper part 1a of the chamber 1. As illustrated in the cross-sectional view of FIG. 2, the dipole ring magnet 24 includes multiple (e.g., 16) anisotropic segment magnets 31 that are arranged within casing 32 corresponding to a ring-shaped magnetic member. The anisotropic segment magnets 31 are arranged at a fixed interval along the circumferential direction of the casing 32. Note that the arrows in the anisotropic segment magnets 31 in FIG. 2 indicate magnetization directions. The magnetization direction of the anisotropic segment magnets 31 are incrementally shifted along the circumferential direction as illustrated in FIG. 2 so that the anisotropic segment magnets 31 as a whole generate a horizontal magnetic field B oriented in one direction.

Accordingly, as illustrated in FIG. 3, a RF electrical field EL in a vertical direction is generated by the first high frequency power supply 15 and the horizontal magnetic field B is generated by the dipole ring magnet 24 within a space between the susceptor 2 and the shower head 20. Such orthogonal electromagnetic field is used to induce a magnetron discharge so that plasma may be generated at a high density near the surface of the susceptor 2.

As the etching gas, a gas mixture of a fluorine compound gas such as sulfur fluoride or carbon fluoride and oxygen ($O_2$) gas may be used, for example. As the fluorine compound gas, a gas having a large number of fluorine within one molecule such as sulfur hexafluoride ($SF_6$) or disulfur decafluoride ($S_2F_{10}$) is preferably used. Also, a silicon fluoride gas such as tetrafluorosilane ($SiF_4$) may be added to the etching gas as a fluorine compound gas. In one example, as illustrated in FIG. 4, the etching gas supply part 23 may include a $SF_6$ gas supply 35, an $O_2$ gas supply 36, and a $SiF_4$ gas supply 37 that respectively have flow rate control valves 35a, 36a, and 37a for individually controlling the flow rates of the respective gases to be supplied.

Overall operations of the plasma etching apparatus with the above configuration are controlled by a control unit 40. The control unit 40 includes a process controller 41, a user interface 42, and a storage unit 43. The process controller 41 includes a CPU and is configured to control operations of various components of the plasma etching apparatus.

The user interface 42 may include a keyboard that is operated by a process controller to input various commands for controlling the process of the plasma etching apparatus, and a display that indicates the operation status of the plasma etching apparatus in visual form, for example.

The storage unit 43 stores recipes that include control programs (software) for enabling the process controller 41 to control various process operations of the plasma etching apparatus and process condition data, for example. The process controller 41 reads a given recipe from the storage unit 43 according to a command from the user interface 42 to execute a desired process at the plasma etching apparatus. In this way, the plasma etching apparatus may perform the desired process under control by the control processor 41. In certain embodiments, the recipes including the control programs and process condition data may be stored in a computer-readable storage medium (e.g., hard disk, CD, flexible disk, semiconductor memory). In other embodiments, the recipes including the control programs and process condition data may be transmitted from another device via a dedicated line, for example.

To perform plasma etching within the plasma etching apparatus having the above configuration, first, the gate valve 13 is opened to introduce the wafer W including a silicon layer corresponding to the processing object into the chamber 1 and place the wafer W on the susceptor 2. Then, the susceptor 2 having the wafer W placed thereon is raised to a height level as shown in FIG. 1, and air is evacuated out of the chamber 1 via the exhaust port 11 by the vacuum pump of the exhaust system 12. Then, the etching gas supply part 23 introduces an etching gas into the chamber 1 at a predetermined flow rate, and the pressure within the chamber 1 is set to a predetermined value. Further, the first high frequency power supply 15 supplies a predetermined high frequency power to the suscpetor 2. Also, the DC power supply 16 applies a DC voltage to the electrode 6a of the electrostatic chuck 6 to fix the wafer W to the susceptor 2. The etching gas discharged from the shower head 20 is turned into plasma through magnetron discharge, and the generated plasma is irradiated on the wafer W. In turn, the wafer W may be etched by the radicals and ions included in the irradiated plasma.

In the following, a plasma etching method according to the present embodiment is described.

FIGS. 5-8 are cross-sectional views illustrating the wafer W at various process steps of the plasma etching method according to the present embodiment. FIG. 9A is a graph illustrating a change in a flow ratio of $O_2$ gas to $SF_6$ gas during the process steps of etching the silicon layer of the wafer W. Note that FIGS. 5-8 are enlarged partial views of a region near an opening portion 54a of the wafer W.

Figure 5:
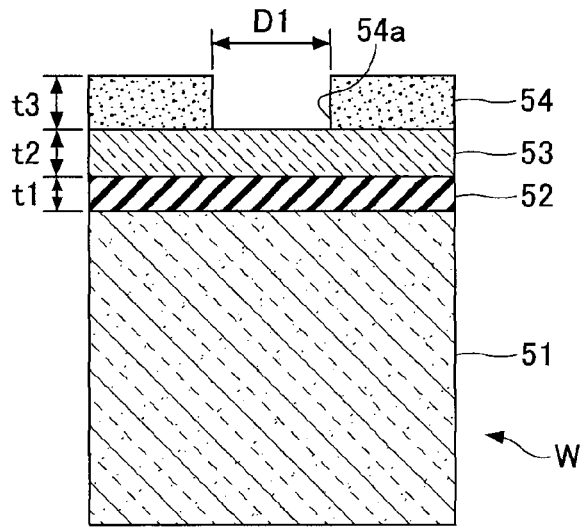
FIG. 5 is a cross-sectional view illustrating a state of a wafer in a process step of the plasma etching method of the first embodiment.

First, a configuration of the wafer W subject to processing by the plasma etching method of the present embodiment is described. As illustrated in FIG. 5, the wafer W includes a base substrate 51 that may be made of a single crystal silicon (Si) layer (also referred to as "silicon layer 51" hereinafter), a first hard mask film 52, a second hard mask film 53, and a mask film 54 that are layered in this order. The first hard mask film 52 may be a silicon nitride (SiN) film having a thickness t1. The thickness t1 may be arranged to be 0.5 μm, for example. The second hard mask film 53 may be a silicon oxide (SiOx) film having a thickness t2. The thickness t2 may be arranged to be 0.5 μm, for example. The mask film 54 may be made of a resist layer having a thickness t3. The thickness t3 may be arranged to be 2.5 μm, for example. A photolithography process may be performed on the mask film 54 beforehand so that the mask film 54 has circular opening portions 54a with a diameter D1 of 8 μm, for example, formed thereon as patterns.

Note that in an alternative embodiment, the first hard mask film 52 may be made of a silicon oxide (SiOx) film and the second hard mask film 53 may be made of a silicon nitride (SiN) film.

The wafer W having such a configuration is introduced into the chamber 1 and placed on the susceptor 2 in the manner described above.

As illustrated in FIG. 9A, first, the silicon layer 51 is etched while the flow ratio of $O_2$ gas to $SF_6$ gas is adjusted to a first flow ratio (step S1). Note that step S1 is an example of a first step of the present invention.

The first flow ratio is preferably a value within a range from 0.9 to 1.1. In this way, the $SF_6$ gas flow rate and the $O_2$ gas flow rate may be arranged to be substantially equal.

After air is evacuated from the chamber 1 by the vacuum pump of the exhaust system 12, etching gas is introduced into the chamber 1 at a predetermined flow rate by the etching gas supply part 23, and the pressure within the chamber 1 is controlled to a predetermined value. In the present example, $SF_6$ gas and $O_2$ gas are supplied at predetermined flow rates as the etching gas. Also, silicon fluoride ($SiF_4$) gas and hydrogen bromide (HBr) gas may be added to etching gas as is necessary or desired. Note that the wafer W is electrostatically attracted to the susceptor 2 by the DC power supply 16, and in this state, the first high frequency power supply 15 applies a first high frequency power to the susceptor 2. As a result, the etching gas discharged from the shower head 20 turns into plasma through magnetron discharge, and the generated plasma is irradiated on the wafer W.

Figure 6:
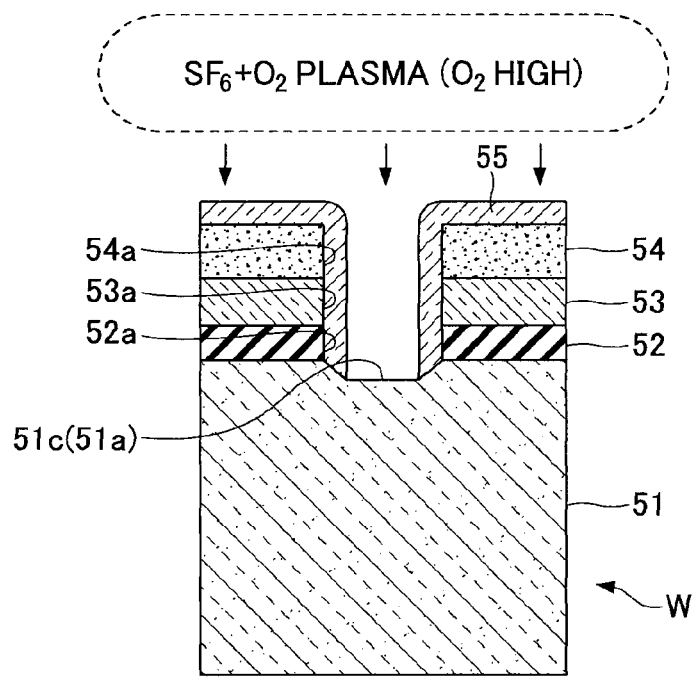
FIG. 6 is a cross-sectional view illustrating a state of a wafer in another process step of the plasma etching method of the first embodiment.

As illustrated in FIG. 6, by irradiating the plasma on the wafer W, opening portions 53a and 52a are respectively formed on the second hard mask film 53 and the first hard mask film 52 at the positions corresponding to the opening portions 54a of the mask film 54, and a hole portion 51a is formed on the base substrate 51.

Note that although the mask film 54 may be etched by the plasma as well, selectivity or the ratio of the etching rate of the second hard mask film 53, the first hard mask film 52, and the base substrate 51 with respect to the etching rate of the mask film 54 is quite high in the present example. Accordingly, in FIG. 6, a change in thickness of the mask film 54 is not illustrated (the same applies to FIG. 7).

For example, in the case where $SF_6$ gas is used as the etching gas, fluorine radicals F* are generated when the etching gas is turned into plasma. When the generated fluorine radicals F* reach the hole portion 51a, the fluorine radicals F* react with Si and $SiF_4$ is generated as illustrated by reaction formula (1) shown below.

$$4F^* + Si \rightarrow SiF_4 \quad (1)$$

Then, the generated $SiF_4$ is discharged outside the hole portion 51a and the silicon layer 51 is etched as a result.

On the other hand, in the case where $O_2$ gas is used as the etching gas, the oxygen radicals O* are generated when the $O_2$ gas is turned into plasma. Also, the $SiF_4$ generated by the above reaction formula (1) may react with plasma, or the fluorine radicals F* may react with Si to generate silicon fluoride radicals SiFx*. In turn, for example, the oxygen radicals O* may react with the silicon fluoride radicals SiFx* as illustrated by reaction formula (2) shown below.

$$O^* + SiFx^* \rightarrow SiOFx \quad (2)$$

As a result, a SiO-based (e.g., SiOFx) protective film 55 may be deposited.

As illustrated in FIG. 6, the protective film 55 is deposited on an upper face of the mask film 54, a side wall of the opening portion 54a of the mask film 54, a side wall of the opening portion 53a of the second hard mask film 53, a side wall of the opening portion 52a of the first hard mask 52, and a side wall 51b (see FIG. 7) of the hole portion 51a of the silicon layer 51. Note that because a bottom face 51c of the hole portion 51a of the silicon layer 51 is located farthest from the surface of the wafer W, a deposition rate of the protective film 55 on the bottom face 51c is comparatively lower than the deposition rate of the protective film 55 on the other portions from the upper face of the mask film 54 to the side wall 51b of the hole portion 51a. Accordingly, anisotropic etching may be performed in which an etching rate of etching the hole portion 51a in its depth direction is higher than an etching rate of etching the hole portion 51a in the lateral direction, and the side wall 51b of the hole portion 51a may be arranged to be substantially perpendicular to the surface of the wafer W.

Figure 9B:
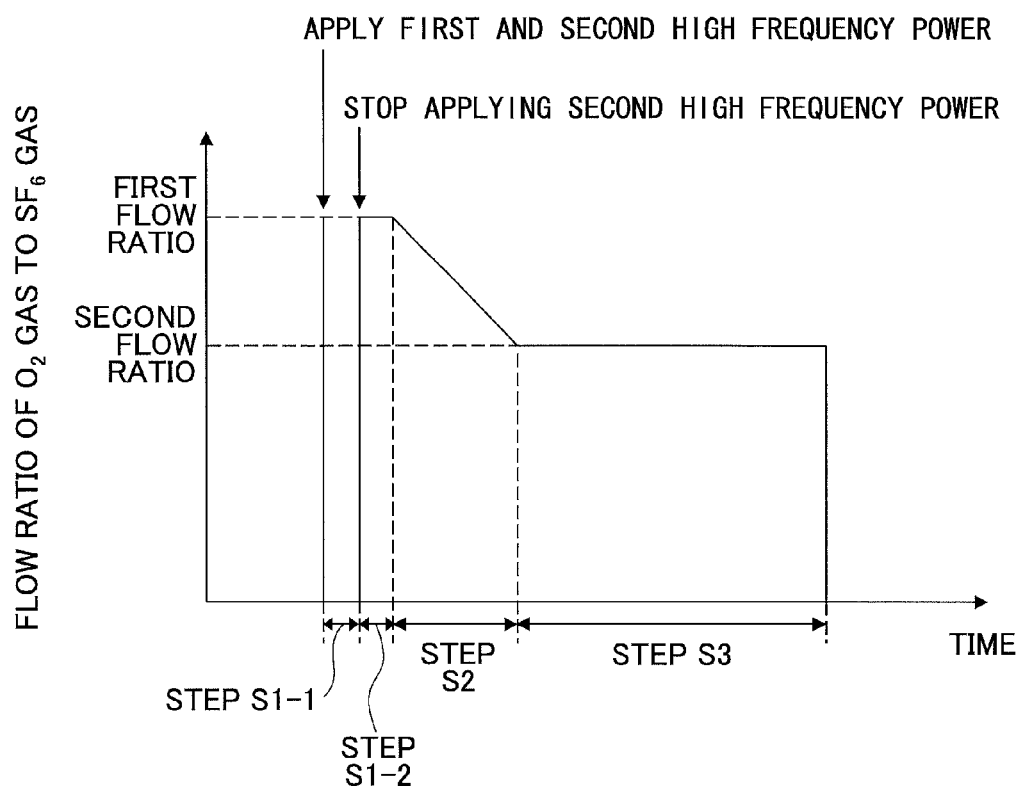
FIG. 9B is a graph illustrating a change in the ratio of $O_2$ gas to $SF_6$ gas and high frequency application during process steps of etching a silicon layer.

In one embodiment, step S1 may be divided into step S1-1 and step S1-2 as illustrated in FIG. 9B. Note that step S1-1 is an example of a fourth step of the present invention, and step S1-2 is an example of a fifth step of the present invention.

In step S1-1, the first high frequency power at the first frequency and the second high frequency power at the second high frequency, which is lower than the first frequency, are applied to the susceptor 2, and the silicon layer 51 is etched in such a state. In this way, a native oxide film or a resist residue on the Si layer surface may be efficiently etched away so that side wall roughening at the hole portion may be prevented.

In step S1-2, to be performed after step S1-1, application of the second high frequency power to the susceptor 2 is stopped so that only the first high frequency power is applied to the susceptor 2, and the silicon layer 51 is etched in such a state.

Next, as illustrated in FIGS. 9A and 9B, the silicon layer 51 is etched while the flow rate of $O_2$ gas is decreased so that the flow ratio of $O_2$ gas to $SF_6$ gas may be changed to a second flow ratio, which is lower than the first flow ratio (step S2). Note that step S2 is an example of a second step of the present invention.

The second flow ratio is preferably a value within a range from 0.7 to 0.9. When the second flow ratio is less than 0.7, the side wall 51b of the hole portion 51a may be exposed as a result of the deposition rate decreasing relative to the etching rate, and this may cause the side wall 51b of the hole portion 51a to be tapered. Also, when the second flow ratio exceeds 0.9, the silicon layer 51 may not be etched at an adequately high speed as a result of the deposition rate increasing relative to the etching rate.

Next, as illustrated in FIGS. 9A and 9B, the flow ratio of $O_2$ gas to $SF_6$ gas is adjusted to the second flow ratio and the silicon layer 51 is etched in such a state (step S3). Note that step S3 is an example of a third step of the present invention.

In step S2, the silicon layer 51 may be etched while the flow ratio of $O_2$ gas to $SF_6$ gas is gradually reduced from the first flow ratio to the second flaw ratio in multiple stages. FIG. 21 is a table illustrating exemplary process steps for etching the silicon layer 51 in this manner.

Note that step S1-1 and step S1-2 indicated in Table 1 of FIG. 21 respectively correspond to step S1-1 and step S1-2 of FIG. 9B. Also, steps S2-1 through 52-3 correspond to step S2 of FIGS. 9A and 9B.

Figure 7:
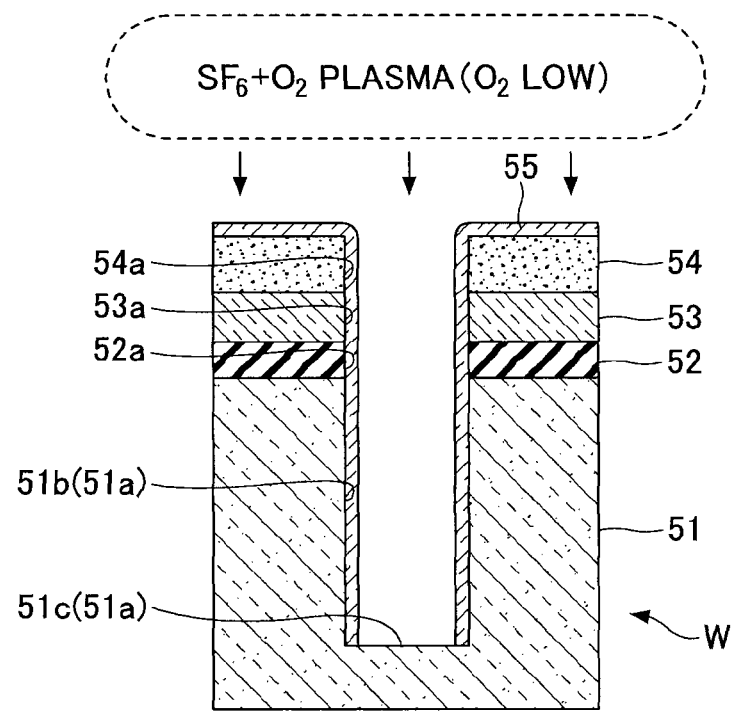
FIG. 7 is a cross-sectional view illustrating a state of a wafer in another process step of the plasma etching method of the first embodiment.

By performing steps S1 through step S3 as described above, the etching process of the silicon layer 51 may be completed, and the hole portion 51a may be formed as illustrated in FIG. 7.

Figure 8:
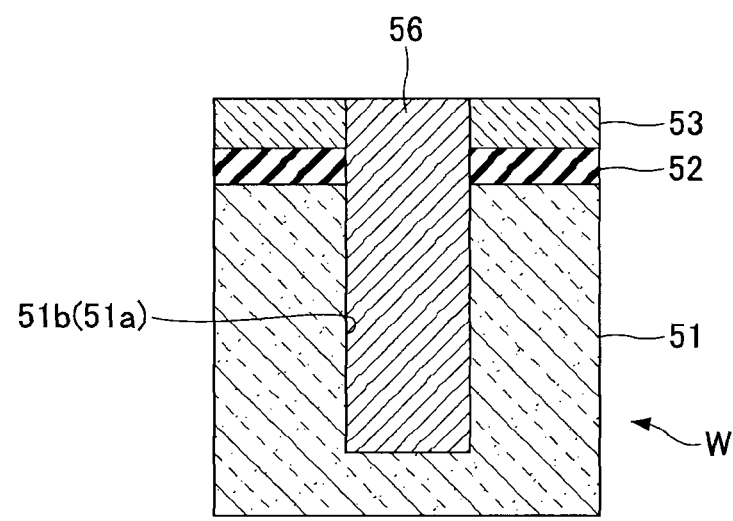
FIG. 8 is a cross-sectional view illustrating a state of a wafer in another process step of the plasma etching method of the first embodiment.

Next, an ashing process may be performed on the mask film 54 using plasma generated from an etching gas containing $O_2$ gas, for example, and the surface of the wafer W with the ashed mask film 54 may be cleaned. Then, wiring metal 56 such as copper (Cu) may be embedded into the hole portion 51a through chemical vapor deposition (CVD), electroplating, or non-electroplating, for example. Then, as illustrated in FIG. 8, excessive wiring metal 56 formed on the surface of the wafer W may be removed through chemical mechanical polishing (CMP), for example. Note that in a case where the second hard mask film 53 or the first hard mask film 52 is made of a silicon nitride film, the silicon nitride film may be used as a CMP stopper film. In such a case, CMP processing end point detection may be performed at an upper end position of the silicon nitride film, for example.

According to an aspect of the plasma etching method of the present embodiment, a side wall of a hole portion formed on a substrate may be arranged to be substantially perpendicular to the surface of the substrate, and the silicon layer of the substrate may be etched at a high speed. The underlying reasons for such effect are described below with reference to Comparative Example 1 and Comparative Example 2.

In a plasma etching process for etching a silicon layer according to Comparative Example 1, only a process step corresponding to step S1-1 indicated in Table 1 of FIG. 21 is performed. However, in Comparative Example 1, the processing time for the process step corresponding to step S1-1 is set to approximately 120 seconds.

In a plasma etching process for etching a silicon layer according to Comparative Example 2, only a process step corresponding to step S3 indicated in Table 1 of FIG. 21 is performed. However, in Comparative Example 2, the processing time for the process step corresponding to step S3 is set to approximately 400 seconds.

Figure 10:
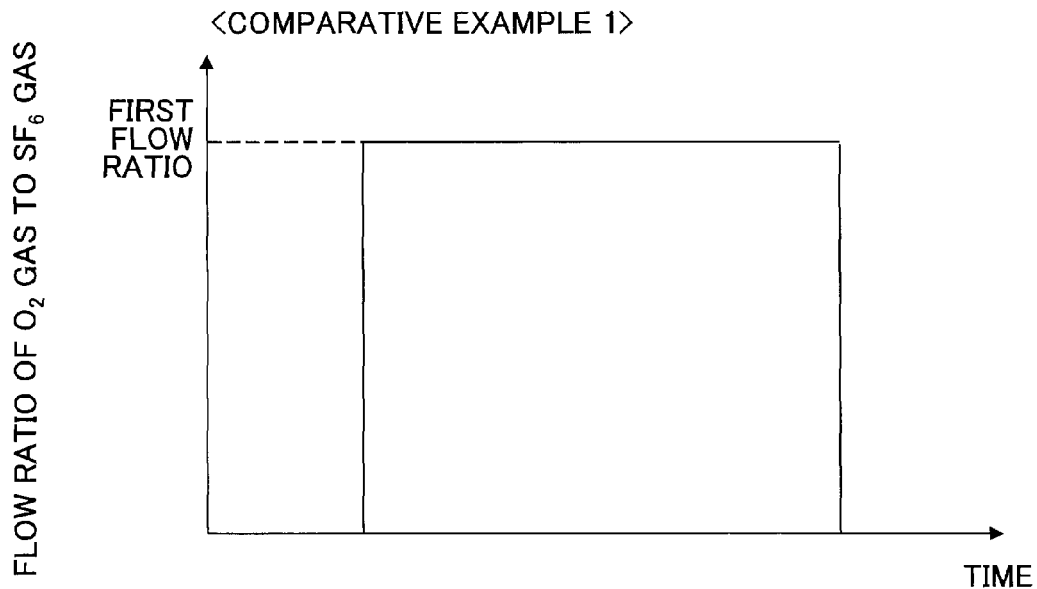
FIG. 10 is a graph illustrating a change in the ratio of $O_2$ gas to $SF_6$ gas in a process of etching a silicon layer according to a first comparative example.
Figure 11:
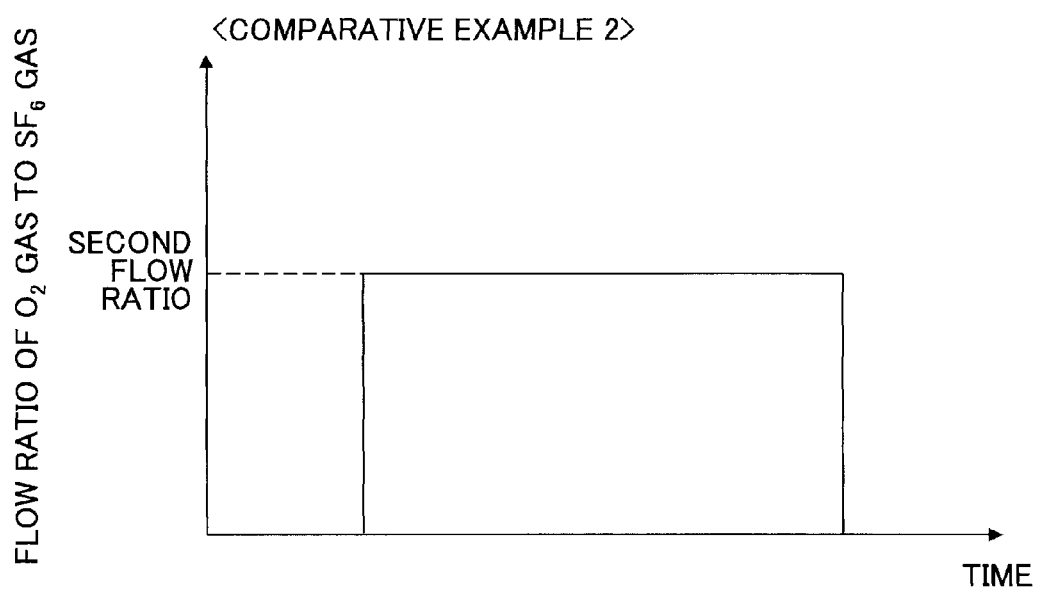
FIG. 11 is a graph illustrating a change in the ratio of $O_2$ gas to $SF_6$ gas in a process of etching a silicon layer according to a second comparative example.
Figure 12:
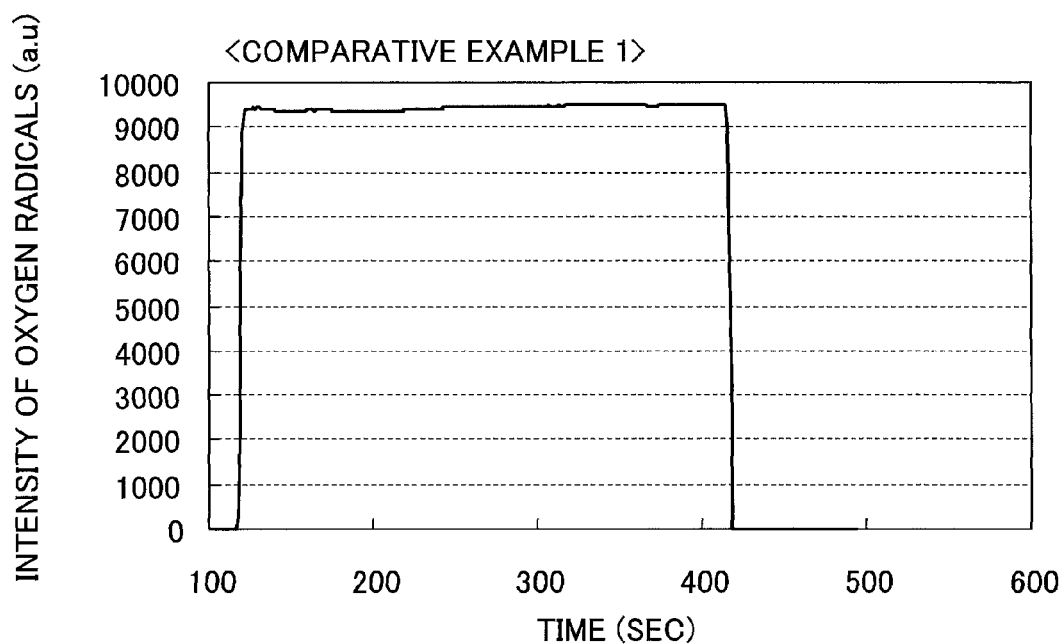
FIG. 12 is a graph illustrating OES measurement results of the emission intensity of oxygen radicals in the process of etching a silicon layer according to the first comparative example.
Figure 13:
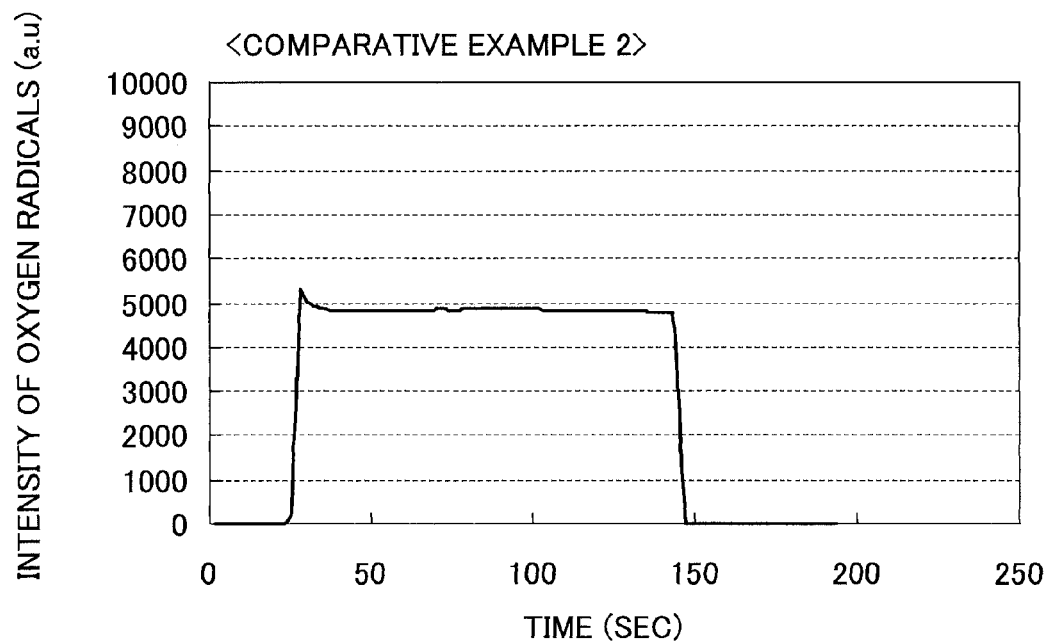
FIG. 13 is a graph illustrating OES measurement results of the emission intensity of oxygen radicals in the process of etching a silicon layer according to the second comparative example.
Figure 14:
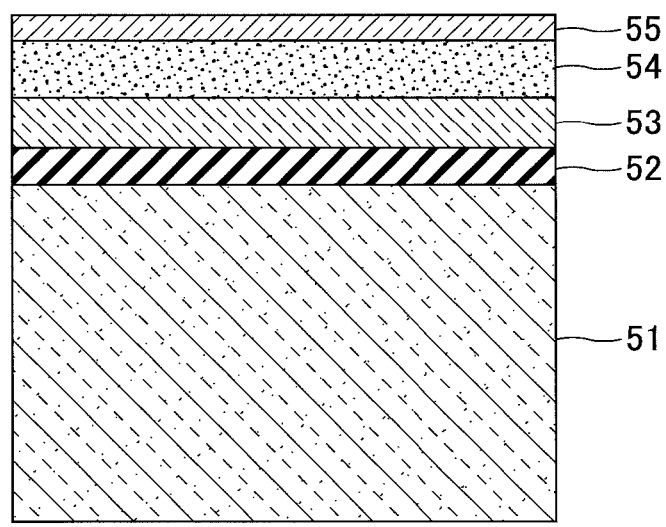
FIG. 14 illustrates a state of a wafer surface in the process of etching a silicon layer according to the first comparative example.
Figure 15:
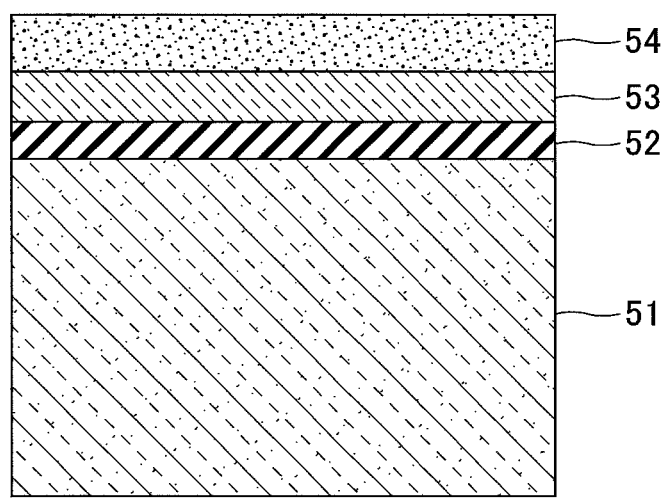
FIG. 15 illustrates a state of a wafer surface in the process of etching a silicon layer according to the second comparative example.

FIGS. 10 and 11 are graphs respectively illustrating changes in the flow ratio of $O_2$ gas to $SF_6$ gas during the process steps for etching a silicon layer according to Comparative Example 1 and Comparative Example 2. FIGS. 12 and 13 are graphs respectively illustrating measurement results of measuring the emission intensity of oxygen radicals using an optical emission spectroscopy (OES) in the process steps for etching a silicon layer according to Comparative Example 1 and Comparative Example 2. FIGS. 14 and 15 respectively illustrate states of the wafer W during the process steps of etching a silicon layer according to Comparative Example 1 and Comparative Example 2.

As illustrated in FIG. 10, in Comparative Example 1, the flow ratio of $O_2$ gas to $SF_6$ gas is arranged to be at the first flow ratio, which is higher than the second flow ratio, and etching gas is turned into plasma in such a state. In this case, as illustrated in FIG. 12, the emission intensity of oxygen radicals O* may become relatively high. This may be due to the deposition rate of the protective film 55 becoming higher than the etching rate of the protective film 55 so that the protective film 55 may be easily deposited on the surface of the mask film 54. In this case, as illustrated in FIG. 14, the surface of the mask film 54 is covered by the protective film 55, and therefore, reaction does not occur between the oxygen radicals O* and the resist layer of the mask film 54. As a result, the mask film 54 that is made up of the resist layer remains on the surface of the wafer W, and the amount of non-reacted oxygen radicals O* within the plasma increases.

As illustrated in FIG. 11, in Comparative Example 2, the flow ratio of $O_2$ gas to $SF_6$ gas is arranged at the second flow ratio, which is lower than the first flow ratio, and etching gas is turned into plasma in such a state. In this case, as illustrated in FIG. 13, the emission intensity of oxygen radicals O* becomes relatively low. This may be due to the deposition rate of the protective film 55 becoming lower than the etching rate of the protective film 55 thereby making it difficult for the protective film 55 to be deposited on the surface of the mask film 54. In this case, as illustrated in FIG. 15, the surface of the mask film 54 is not covered by the protective film 55, and therefore, the oxygen radicals O* react with the resist layer of the mask film 54. As a result, the mask film 54 including the resist layer does not remain on the surface of the wafer W, and the amount of non-reacted oxygen radicals O* within the plasma may be reduced.

Figure 16:
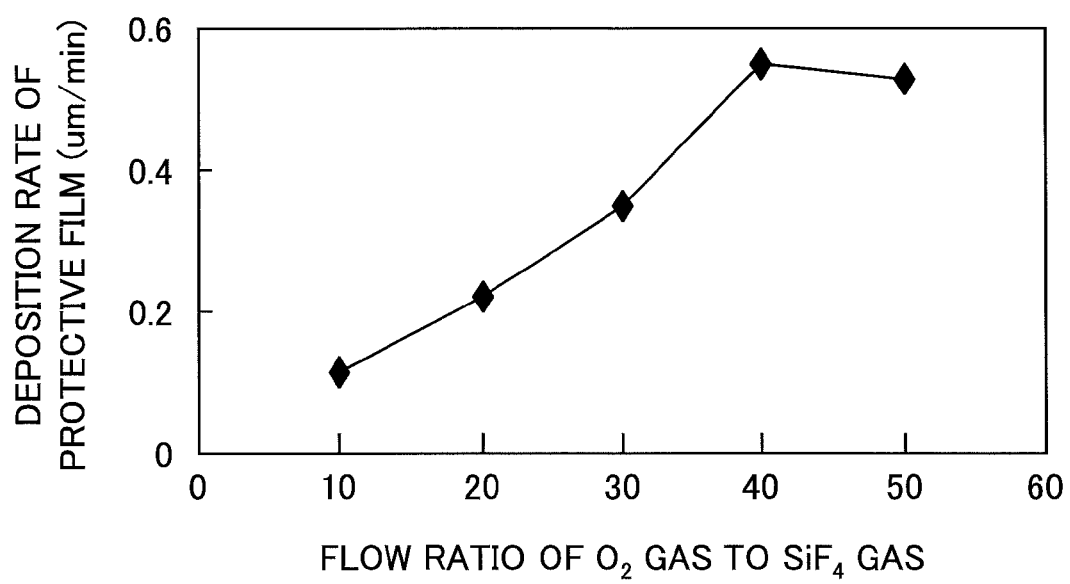
FIG. 16 is a graph illustrating measurement results of measuring the deposition rate of a protective film while varying a flow ratio of $O_2$ gas to $SiF_4$ gas.

Also, the deposition rate of the protective film 55 was measured while changing the flow ratio of $O_2$ gas to $SiF_4$ gas. FIG. 16 is a graph illustrating the measurement results obtained in this case. As shown in Table 1 of FIG. 21, the ratio of $SF_6$ gas to $SiF_4$ gas is fixed during a process step. Accordingly, while the horizontal axis of FIG. 16 represents the flow ratio of $O_2$ gas to $SiF_4$ gas, it also indirectly represents a relative change of the flow ratio of $O_2$ gas to $SF_6$ gas. As can be appreciated from FIG. 16, as the flow ratio of $O_2$ gas to $SiF_4$ gas increases; namely, as the flow ratio of $O_2$ gas to $SF_6$ gas increases, the deposition rate of the protective film 55 increases at a substantially uniform rate.

Figure 17:
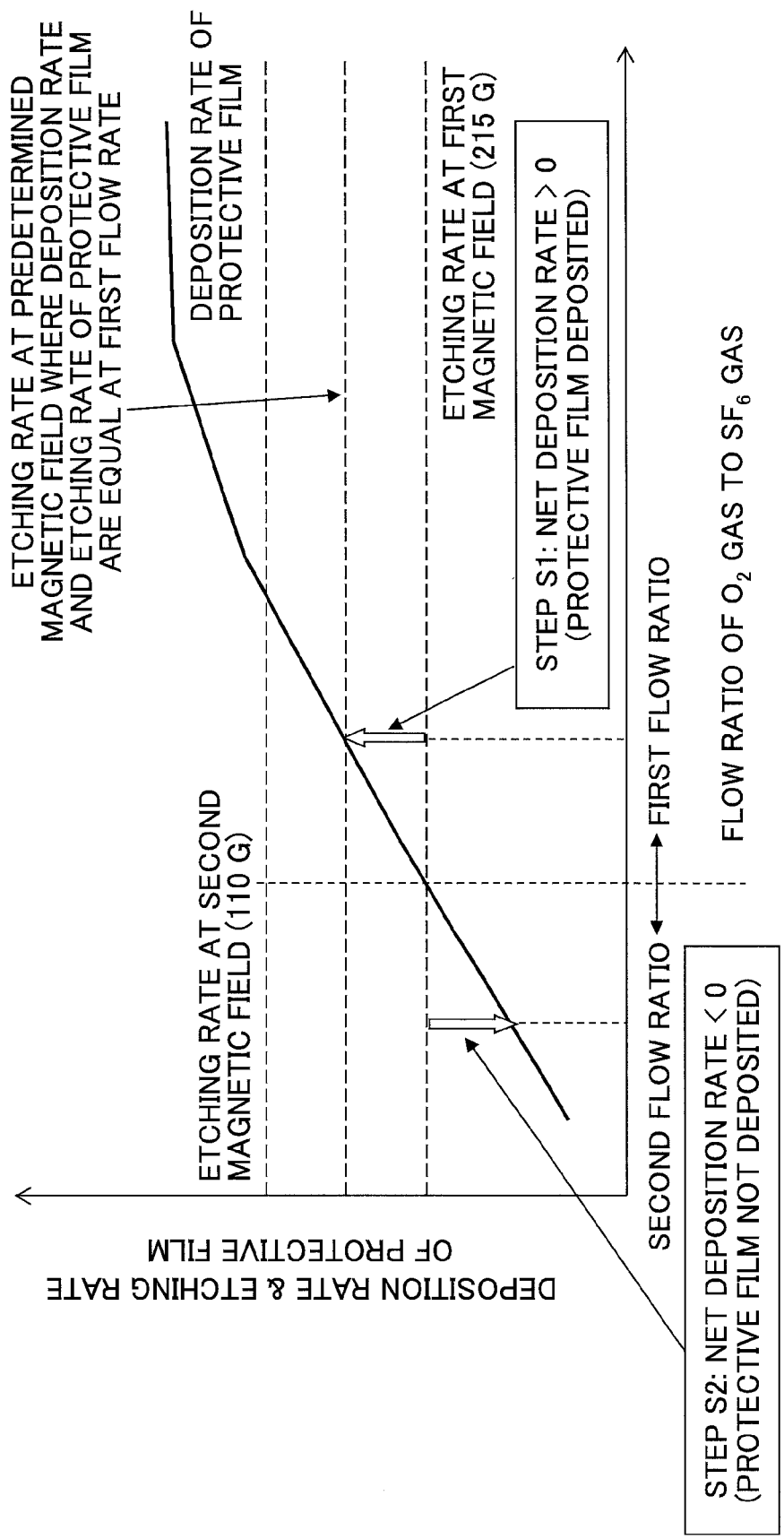
FIG. 17 is a graph illustrating a relationship between the flow ratio of $O_2$ gas to $SF_6$ gas and the deposition rate and etching rate of the protective film.

FIG. 17 is a graph illustrating a relationship between the flow ratio of $O_2$ gas to $SF_6$ gas and the deposition rate and etching rate of the protective film 55. As illustrated in FIG. 17, the deposition rate of the protective film 55 increases at a substantially uniform rate as the flow ratio of $O_2$ gas to $SF_6$ gas increases. On the other hand, the etching speed of the protective film 55 is believed to remain substantially unaffected by the flow ratio of $O_2$ gas to $SF_6$ gas. Thus, the etching rates of the protective film 55 are represented by substantially horizontal broken lines in FIG. 17. As can be appreciated, when the flow ratio of $O_2$ gas to $SF_6$ gas is equal to a predetermined value, the deposition rate and the etching rate of the protective film 55 may be equal to each other. When the flow ratio of $O_2$ gas to $SF_6$ gas is less than the predetermined flow ratio, the protective film 55 is not deposited on the surface of the wafer W, and the surface of the wafer W is etched as a result. On the other hand, when the flow ratio of $O_2$ gas to $SF_6$ gas is greater than the predetermined flow ratio, the protective film 55 is deposited on the surface of the wafer W.

As illustrated in FIG. 1, in the present embodiment, the flow ratio of $O_2$ gas to $SF_6$ gas is adjusted to the first flow rate at which the flow ratio of $O_2$ gas to $SF_6$ gas is greater than or equal to the predetermined flow rate and the protective film 55 is deposited on the surface of the wafer W, and etching is performed in such a state. Thereafter, the flow ratio of $O_2$ gas to $SF_6$ gas is adjusted to the second flow rate that is lower than the first flow rate, and etching is performed in such a state. At the second flow rate, the flow ratio of $O_2$ gas to $SF_6$ gas is less than the predetermined flow rate, the protective film 55 is not deposited, and the surface of the wafer W is etched as a result. Accordingly, when etching is started, the deposition rate of the protective film is higher than the etching rate of the protective film and the net deposition rate equals a positive value. In this way, the protective film 55 may be deposited on the surface of the resist layer and the side wall of the hole portion. As the etching progresses, the deposition rate of the protective film 55 becomes lower than the etching rate of the protective film 55, and the net deposition rate becomes a negative value. In this way, the protective film 55 is prevented from being deposited on the surface of the resist layer and the side wall of the hole portion. Thus, the diameter of the hole portion may be prevented from gradually becoming smaller along the depth direction of the hole portion, the hole portion may be prevented from becoming narrower at its end portion, and the side wall of the hole portion may be arranged to be substantially perpendicular to the surface of the wafer W.

Figure 18:
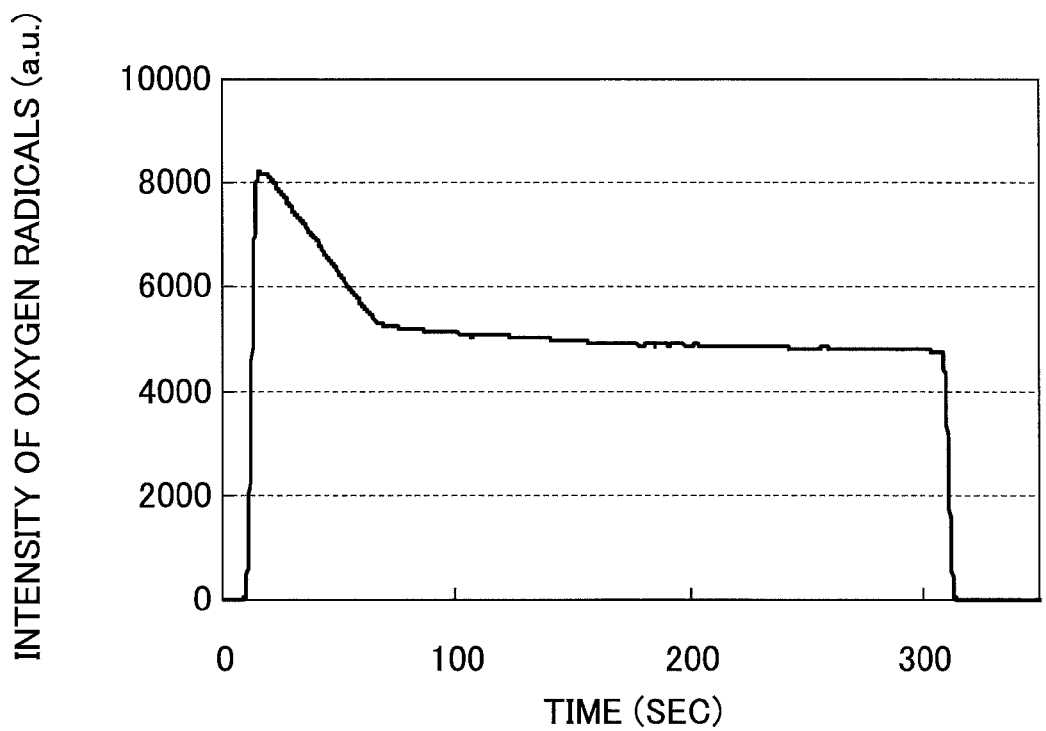
FIG. 18 is a graph illustrating OES measurement results of the emission intensity of oxygen radicals in process steps of etching a silicon layer according to the first embodiment.

FIG. 18 is a graph illustrating measurement results of measuring the emission intensity of oxygen radicals using an OES in a process of etching a silicon layer according to the present embodiment.

As can be appreciated from FIG. 18, when etching is started, the emission intensity of oxygen radicals O* is relatively high. Then, the emission intensity of oxygen radicals O* decreases after which the emission intensity of oxygen radicals O* is maintained at a relatively low level. Such a change in the emission intensity of oxygen radicals corresponds to the change in the flow ratio of $O_2$ gas to $SF_6$ gas. That is, the flow ratio of $O_2$ gas to $SF_6$ gas is at a relatively high flow ratio in step S1 and gradually decreases in step S2 to be maintained at a relatively low flow ratio in step S3. Accordingly, in the present embodiment, the amount of non-reacted oxygen radicals O* may be controlled by changing the flow ratio of $O_2$ gas to $SF_6$ gas.

Further, in the present embodiment, a first magnetic field is applied to the wafer W. The first magnetic field is greater than a predetermined magnetic field, which causes the deposition rate of depositing the protective film through reaction of plasma with the resist layer to be equal to the etching rate of etching the protective film when the flow ratio of $O_2$ gas to $SF_6$ gas is adjusted to the first flow ratio.

When the magnitude of a magnetic field near the wafer surface is increased, the radius of the circular motion of electrons around the magnetic field lines (Larmor radius) becomes smaller. That is, the electrons near the wafer surface remain tied to a region near the wafer surface, and as a result, the electron density near the wafer surface increases. The plasma density near the wafer surface similarly increases, and the self-bias voltage decreases as a result.

The reason why the self-bias voltage decreases as the plasma density near the wafer surface similarly increases is explained below.

Assuming P denotes the high frequency power supplied to the susceptor 2, I denotes the plasma current, and V denotes the self-bias voltage, the relationship between P, I, and V may be expressed by the following formula (3).

$$P = I \cdot V \tag{3}$$

Also, the plasma current I is believed to be substantially proportional to the plasma density. Thus, when the high frequency power P supplied to the susceptor 2 is constant, as the plasma density increases, the plasma current I increases and the self-bias voltage V decreases.

When the self-bias voltage decreases as the plasma density increases as described above, the kinetic energy of ions irradiated on the wafer W also decreases. Thus, when the magnitude of the magnetic field near the wafer surface is increased to the first magnetic field from a second magnetic field, which is smaller than the first magnetic field, the etching rate decreases. In turn, as illustrated in FIG. 17, the flow ratio of $O_2$ gas to $SF_6$ gas when the deposition rate and the etching rate of the protective film 55 are equal decreases. In other words, provided the flow rate of $SF_6$ gas is maintained constant, the flow rate of $O_2$ gas for adjusting the net deposition rate obtained by subtracting the etching rate from the deposition rate of the protective film to a predetermined rate decreases when the magnitude of the magnetic field near the wafer surface is increased from the second magnetic field to the first magnetic field, for example. The first magnetic field may be 215 G, for example, and the second magnetic field may be 110 G, for example.

In the present embodiment, when starting plasma etching, the first magnetic field is applied to the wafer, and the flow ratio of $O_2$ gas to $SF_6$ gas is adjusted to the first flow ratio. Meanwhile, plasma generated from the etching gas reacts with the resist layer, and in this way, a protective film may be deposited on the surface of the resist layer and the side wall of a hole portion. The first magnetic field is greater than the predetermined magnetic field, which causes the deposition rate of depositing the protective film on the surface of the resist layer and the side wall of the hole portion to be equal to the etching rate of etching the protective film when the flow ratio of $O_2$ gas to $SF_6$ gas is adjusted to the first flow ratio. Thus, in the present embodiment, when etching is started, the deposition rate of the protective film is arranged to be greater than the etching rate of the protective film, and in this way, the protective film may be deposited on the surface of the resist layer and the side wall of the hole portion to be formed.

However, when the flow rate of $O_2$ gas remains constant, as the etching progresses; namely, as the depth dimension of the hole portion increases, excess oxygen radicals generated from turning the etching gas into plasma may enter the hole portion and the protective film may deposited on the side wall of the hole portion. In this case, the diameter of the hole portion may gradually become smaller in the depth direction of the hole portion so that the hole portion may become narrower toward its end, and as a result, the side wall of the hole portion may not be arranged substantially perpendicular to the wafer surface.

Accordingly, in one aspect of the plasma etching method according to the present embodiment, as the etching progresses; namely, as the depth dimension of the hole portion increases, the flow rate of $O_2$ gas is decreased while the flow rate of $SF_6$ gas is maintained at a constant value. In this way, the amount of oxygen radicals supplied to the hole portion may be reduced, and the deposition rate at which the protective film is deposited on the side wall of the hole portion may be decreased. Thus, the etching rate of the protective film may increase relative to the deposition rate of the protective film. In this way, the protective film may be prevented from being deposited on the side wall of the hole portion. Thus, the diameter of the hole portion may be prevented from gradually becoming smaller in the depth direction of the hole portion, the hole portion may be prevented from becoming narrower toward its end, and the side wall of the hole portion may be arranged substantially perpendicular to the wafer surface in a relatively simple manner.

Also, in another aspect of the present embodiment, the flow rate of $O_2$ gas for adjusting the net deposition rate of the protective film to a desired rate may be decreased by increasing the magnitude of the magnetic field applied to the wafer W. Accordingly, while adjusting the net deposition rate of the protective film to a desired rate, the actual amount of fluorine radicals F* supplied to the hole portion may be increased so that the etching rate of etching the hole portion may be increased. In this way etching of the silicon layer may be further accelerated.

Note that in the embodiment described above with reference to Table 1 of FIG. 21, a net etching rate of 10.95 μm/min could be obtained at the center of the wafer surface. On the other hand, in Comparative Example 3, where processing conditions similar to Comparative Example 1 were implemented and a magnetic field of 110 G was applied to the wafer, a net etching rate of 8.77 μm/min could be obtained at the center of the wafer surface. That is, a higher etching rate could be obtained in the present embodiment compared to the etching rate obtained in Comparative Example 3.

Second Embodiment

In the following, a plasma etching method according to a second embodiment of the present invention is described.

The plasma etching method according to the second embodiment may be implemented using a plasma etching apparatus similar to the plasma etching apparatus used in the first embodiment. Accordingly, descriptions of the plasma etching apparatus used in the second embodiment are omitted.

The plasma etching method according to the present embodiment relates to forming a via hole through a wafer using the so-called TSV (Through-Silicon Via) technology in order to form a via electrode within a three-dimensionally stacked semiconductor device. That is, the plasma etching method according to the present embodiment differs from that of the first embodiment in that it involves etching a bonded wafer that includes a wafer on which a via hole is formed (also referred to as "device wafer") and a support wafer to which the device wafer is bonded via an adhesive.

Figure 19:
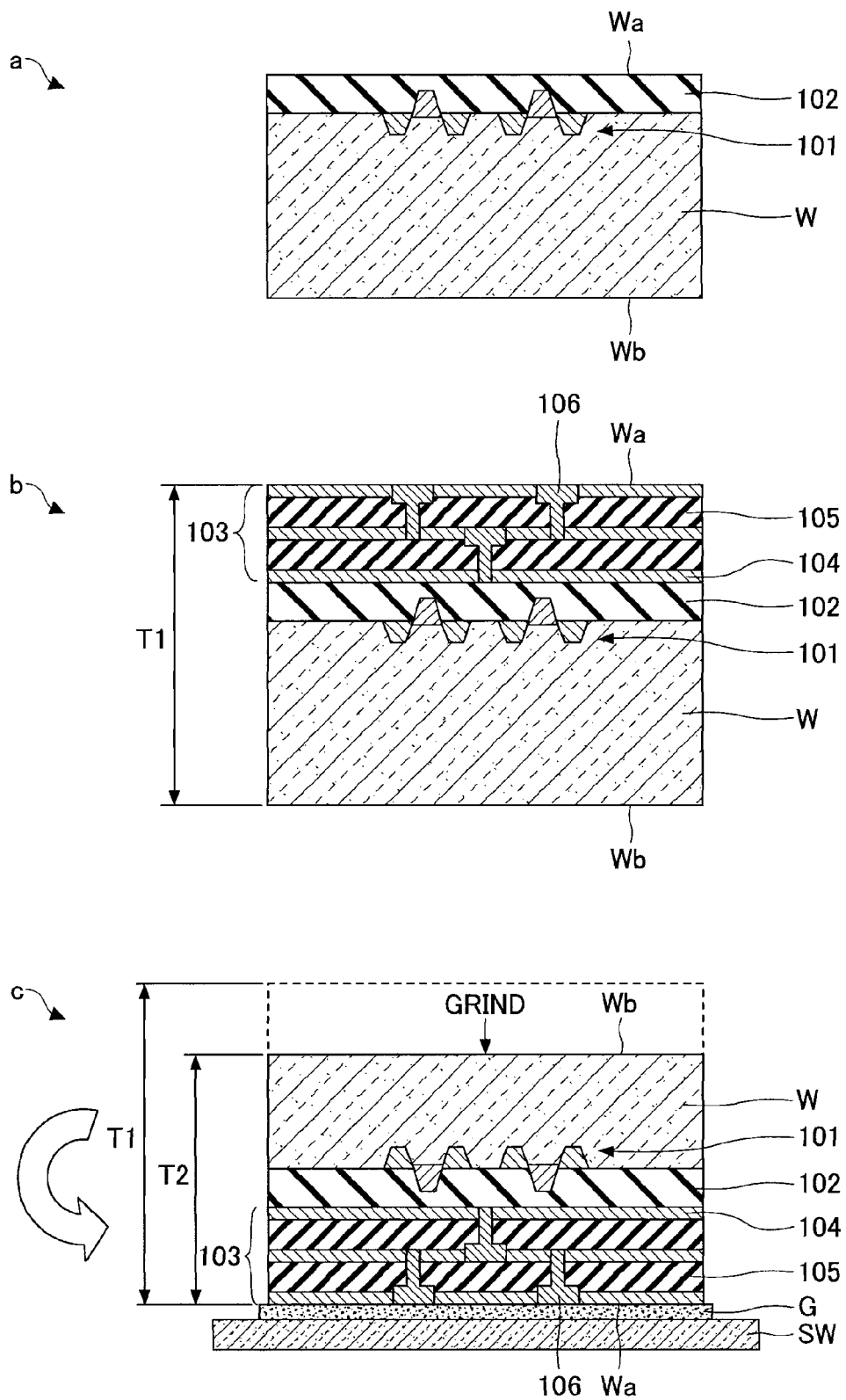
FIG. 19 illustrates wafer states in various process steps of a semiconductor device manufacturing method including a plasma etching method according to a second embodiment of the present invention.
Figure 20:
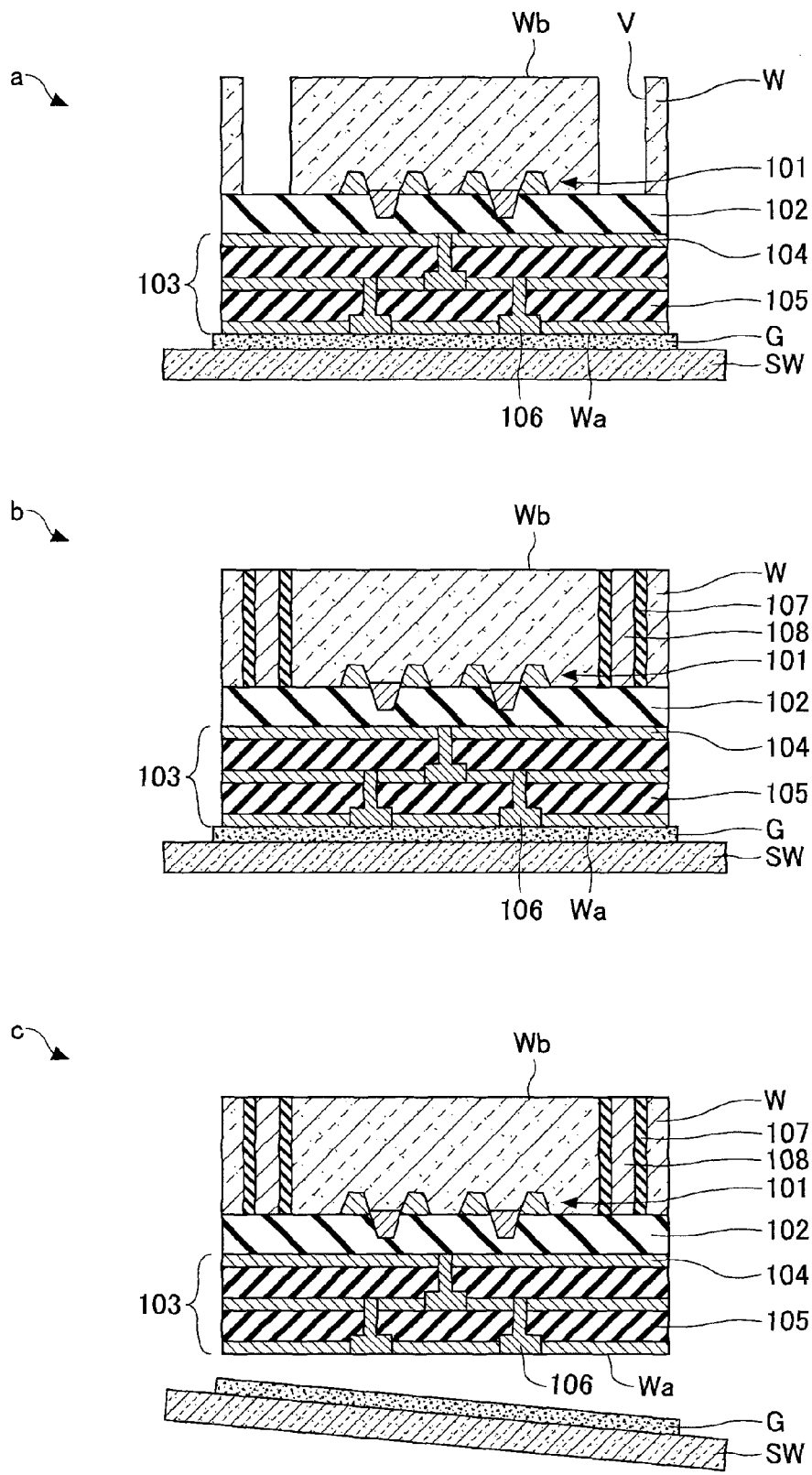
FIG. 20 illustrates wafer states in further process steps of the semiconductor device manufacturing method including the plasma etching method according to the second embodiment.

FIGS. 19 and 20 are cross-sectional views illustrating wafer states at various process steps of a semiconductor device manufacturing method including the plasma etching method of the present embodiment.

In FIG. 19, c represents a bonded wafer including a device wafer W and a support wafer SW. The device wafer W is a substrate having a semiconductor device such as a transistor formed on its surface Wa. The support wafer SW is a support substrate for reinforcing the device wafer W when the device wafer W is thinned by a grinding process that is performed on its backside Wb. The device wafer W is bonded to the support wafer SW via an adhesive G.

In the plasma etching method according to the present embodiment, first, a transistor 101 is formed on the surface of the device wafer W, which may be a silicon wafer, for example. Then, an interlayer insulating film 102 is formed on the device wafer W having the transistor 101 formed thereon (see a of FIG. 19).

Next, a wiring structure 103 is formed on the interlayer insulating film 102. The wiring structure 103 is formed on the interlayer insulating film 102 by alternately layering a wiring layer 104 and an insulating film 105 and forming a via hole 106, which penetrates through the insulating film 105 and establishes electrical connection between the wiring layers 104 arranged above and below the insulating film 105 (see b of FIG. 19).

Next, the device wafer W is turned upside down and is bonded to the support wafer SW via an adhesive G to prepare the bonded wafer. The support wafer SW may be a silicon wafer, for example. The support wafer SW acts as a support substrate that reinforces the device wafer W and prevents the device wafer W from warping when the device wafer W is reduced in thickness by a grinding process that is performed on its backside Wb. The bonded wafer is placed on a support member of a grinding apparatus, for example, and the backside Wb of the device wafer W is subject to a grinding process so that the device wafer W may be thinned from a thickness T1 before grinding to a predetermined thickness T2 after grinding (see c of FIG. 19). The predetermined thickness T2 may be 50-200 μm, for example.

Note that in FIGS. 19 and 20, the interlayer insulating film 102 and the wiring structure 103 are not drawn to scale. That is, for purposes of illustration, the thicknesses of the interlayer insulating film 102 and the wiring structure 103 are magnified. However, in actual applications, the interlayer insulating film 102 and the wiring structure 103 are much thinner than the device wafer W itself.

Next, a resist is applied on the backside Wb of the device wafer W after which the resist is exposed and developed into a resist pattern (not shown). Then, the backside Wb is etched by an etching process that is similar to that implemented in the plasma etching method according to the first embodiment to form a via hole V. Then, an ashing process similar to that implemented in the plasma etching method of the first embodiment is performed to remove the resist remaining on the backside Wb of the device wafer W having the via hole V formed thereon (see a of FIG. 20). The diameter of the via hole V may be 1-10 μm, for example. Also, the depth of the via hole V corresponds to the thickness of the thinned device wafer W after its backside Wb has undergone the grinding process. As described above, the thickness of the thinned device wafer W may be 50-200 μm, for example.

Next, an insulating film 107 made of polyimide, for example, is arranged to cover the inner peripheral face of the via hole V, and a via electrode 108 is formed within the via hole V having its inner peripheral face covered by the insulating film 107 through an electrolytic plating process, for example (see b of FIG. 20).

Next, the support wafer SW is separated from the device wafer W, so that the device wafer W that is thinned and has the via electrode 108 formed therein may be obtained. For example, the support wafer SW may be separated from the device wafer W by irradiating ultraviolet (UV) light and weakening the adhesion of the adhesive G (see c of FIG. 20).

As with the first embodiment, in the present embodiment, the flow ratio of $O_2$ gas to $SF_6$ gas is adjusted to the first flow ratio, and etching is performed in such a state. Then, the flow ratio of $O_2$ gas to $SF_6$ gas is adjusted to the second flow ratio, which is lower than the first flow ratio, and etching is performed in such a state. Thus, at the time etching is started, the deposition rate of the protective film is arranged to be greater than the etching rate of the protective film, and in this way, the protective film may be deposited on the surface of the resist layer and the side wall of the via hole. As the etching progresses, the deposition rate of the protective film is decreased relative to the etching rate of the protective film, and in this way, the protective film may be prevented from being deposited on the surface of the resist layer and the side wall of the via hole. Thus, the diameter of the hole portion may be prevented from gradually becoming smaller in the depth direction of the via hole, the via hole may be prevented from becoming narrower, and the side wall of the via hole may be arranged substantially perpendicular to the wafer surface in a relatively simple manner.

Also, as in the first embodiment, the first magnetic field is applied to the device wafer W in the plasma etching process step of the present embodiment for etching the device wafer W to the wafer state illustrated in FIG. 20 (a). The first magnetic field is greater than the predetermined magnetic field, which causes the deposition rate of depositing the protective film through reaction of plasma with the resist layer to be equal to the etching rate of etching the protective film when the flow ratio of $O_2$ gas to $SF_6$ gas is adjusted to the first flow ratio. In this way, the net deposition rate of the protective film may be adjusted to a desired rate, and at the same time, the actual amount of fluorine radicals F* supplied to the hole portion may be increased so that the etching rate of etching the hole portion may be increased.

Although the present invention is described above with respect to certain preferred embodiments, the present invention is not limited to these embodiments. That is, additional advantages and modifications will readily occur to those skilled in the art in light of the above disclosures. Therefore, the invention in its broader aspects is not limited to the specific details and representative embodiments shown and described herein. Accordingly, various modifications may be made without departing from the spirit or scope of the general inventive concept as defined by the appended claims and their equivalents.

The present application is based on and claims the benefit of priority of Japanese Patent Application No. 2011-133482 filed on Jun. 15, 2011, the entire contents of which are herein incorporated by reference.

DESCRIPTION OF THE REFERENCE NUMERALS 1 chamber (processing chamber)
2 susceptor
4 support
15 first high frequency power supply
20 shower head
23 etching gas supply part
24 dipole ring magnet
26 second high frequency power supply
35 $SF_6$ gas supply
36 $O_2$ gas supply
40 control unit
51 base (silicon layer)
51a hole portion
51b side wall
54 mask film (resist layer)
55 protective film

The invention claimed is:

1. A plasma etching method that involves supplying an etching gas containing an oxygen gas and a sulfur fluoride gas at a predetermined flow rate into a processing chamber that accommodates a processing substrate, which includes a silicon layer and a resist layer that is arranged into a predetermined pattern on the silicon layer, and etching the silicon layer with plasma generated from the etching gas supplied to the processing chamber using the resist layer as a mask, the method comprising:

a first step of etching the silicon layer while a flow ratio of the oxygen gas to the sulfur fluoride gas is adjusted to a first flow ratio;

a second step of etching the silicon layer while decreasing a flow rate of the oxygen gas to decrease the flow ratio of the oxygen gas to the sulfur fluoride gas to a second flow ratio, which is lower than the first flow ratio; and a third step of etching the silicon layer while the flow ratio of the oxygen gas to the sulfur fluoride gas is adjusted to the second flow ratio, wherein
the silicon layer is etched while a first power having a first frequency is supplied to a support part that supports the processing substrate within the processing chamber; and the first step further includes
a fourth step of etching the silicon layer while the first power and a second power having a second frequency, which is lower than the first frequency, are supplied to the support part; and a fifth step, to be performed after the fourth step, including stopping the supply of the second power to the support part, and etching the silicon layer while the first power is supplied to the support part.

2. The plasma etching method as claimed in claim 1, wherein in the first step through the third step, the silicon layer is etched while a first magnetic field is applied to the processing substrate, the first magnetic field being greater than a predetermined magnetic field that causes a deposition rate of depositing a protective film on a surface of the processing substrate through reaction of the plasma generated from the etching gas with the resist layer to be equal to an etching rate of etching the protective film when the flow ratio is set equal to the first flow ratio.

3. The plasma etching method as claimed in claim 1, wherein the silicon layer is etched to form a hole portion; and in the first step through third step, the silicon layer is etched while a first magnetic field is applied to the processing substrate, the first magnetic field being greater than a predetermined magnetic field that causes a deposition rate of depositing a protective film on a surface of the resist layer and a side wall of the hole portion through reaction of oxygen radicals within the plasma generated from the etching gas with the resist layer to be equal to an etching rate of etching the protective film when the flow ratio is set equal to the first flow ratio.

4. A plasma etching method that involves supplying an etching gas containing an oxygen gas and a sulfur fluoride gas at a predetermined flow rate into a processing chamber that accommodates a processing substrate, which includes a silicon layer and a resist layer that is arranged into a predetermined pattern on the silicon layer, and etching the silicon layer with plasma generated from the etching gas supplied to the processing chamber using the resist layer as a mask, the method comprising:
an initial etching step including depositing a protective film on a surface of the processing substrate while applying a first magnetic field to the processing substrate and adjusting a flow ratio of the oxygen gas to the sulfur fluoride gas to a first flow ratio, the first magnetic field being greater than a predetermined magnetic field which, when applied while the flow ratio of the oxygen gas to the sulfur fluoride gas is adjusted to the first flow ratio, causes an etching rate of etching the protective film to be equal to a deposition rate of depositing the protective film on the surface of the processing substrate through reaction of the plasma generated from the etching gas with the resist layer; and
a subsequent etching step, to be performed as etching progresses, including decreasing a flow rate of the oxygen gas while applying the first magnetic field to the processing substrate, and increasing the etching rate relative to the deposition rate.

5. A plasma etching method that involves supplying an etching gas containing an oxygen gas and a sulfur fluoride gas at a predetermined flow rate into a processing chamber that accommodates a processing substrate, which includes a silicon layer and a resist layer that is arranged into a predetermined pattern on the silicon layer, and etching the silicon layer with plasma generated from the etching gas supplied to the processing chamber using the resist layer as a mask to form a hole portion, the method comprising:
an initial etching step including depositing a protective film on a surface of the resist layer and a side wall of the hole portion to be formed while applying a first magnetic field to the processing substrate and adjusting a flow ratio of the oxygen gas to the sulfur fluoride gas to a first flow ratio, the first magnetic field being greater than a predetermined magnetic field which, when applied while the flow ratio of the oxygen gas to the sulfur fluoride gas is adjusted to the first flow ratio, causes an etching rate of etching the protective film to be equal to a deposition rate of depositing the protective film on the surface of the resist layer and the side wall of the hole portion through reaction of oxygen radicals within the plasma generated from the etching gas with the resist layer; and
a subsequent etching step, to be performed as a depth dimension of the hole portion increases, including decreasing a flow rate of the oxygen gas while applying the first magnetic field to the processing substrate, and increasing the etching rate relative to the deposition rate.

* * * * *